United States Patent [19]

Pollmeier

[11] Patent Number: 5,652,553
[45] Date of Patent: Jul. 29, 1997

[54] SIGNAL TRANSMISSION BETWEEN MODULES CONNECTED TO A COMMON BACKPLANE

[75] Inventor: Werner Pollmeier, Verl, Germany

[73] Assignee: Siemens Nixdorf Informationssysteme Aktiengesellschaft, Paderborn, Germany

[21] Appl. No.: 525,600

[22] PCT Filed: Feb. 4, 1994

[86] PCT No.: PCT/DE94/00109

§ 371 Date: Sep. 20, 1995

§ 102(e) Date: Sep. 20, 1995

[87] PCT Pub. No.: WO94/22184

PCT Pub. Date: Sep. 29, 1994

[30] Foreign Application Priority Data

Mar. 22, 1993 [DE] Germany ............ 43 09 147.4

[51] Int. Cl.$^6$ .................................. H01R 23/68
[52] U.S. Cl. ................. 333/1; 333/246; 361/788; 439/85
[58] Field of Search ................. 333/1, 12, 181, 333/238, 246; 174/250, 261; 439/61, 85; 361/788, 794

[56] References Cited

U.S. PATENT DOCUMENTS 3,992,686 11/1976 Canning ................. 333/238

5,027,089 6/1991 Henke ............... 333/12
5,278,524 1/1994 Mullen ............... 333/1

FOREIGN PATENT DOCUMENTS 0 414 546 2/1991 European Pat. Off. .
38 38 486 5/1990 Germany .

OTHER PUBLICATIONS

Texas Instruments: The TTL Data Book, vol. 2, 1985, pp. 5–24 through 5–41 no month.
TTL–Kochbuch, Muenchen 1975, pp. 259–261 no month.
C.M. Wintzer, Surface Mount Technologies Application Specific IC, International Conf. Jun. 1988, pp. 70–71.
B.C. Wadell, Transmission Line Design Handbook, Artech House, Inc., 1991, pp. 126–129 no month.
J. Fouladian et al, Generalized Analytical Equations for Strip Transmission Lines, Microwave Journal, Nov. 1989, pp. 165–168.

Primary Examiner—Paul Gensler
Attorney, Agent, or Firm—Hill, Steadman & Simpson

[57] ABSTRACT

In a system having modules (20), voltage supply (15), signal transmission via terminated signal lines (13) and signal ground (14), the impedance of the signal lines (13) with respect to both the signal ground (14) and the voltage supply (15) is identical, an AC coupling of the contacts for signal ground and voltage supply being effected on the modules and close to the termination of the signal lines.

5 Claims, 3 Drawing Sheets

SIGNAL TRANSMISSION BETWEEN MODULES CONNECTED TO A COMMON BACKPLANE

BACKGROUND OF THE INVENTION

1. Technical Field

This concerns signal transmission of digital signals in computing installations having rapid communication via a backplane common to a plurality of subassemblies.

2. Prior Art

Computing installations are constructed as a rule from subassemblies which exchange data with one another. These subassemblies are arranged in pluggable fashion on a carrier board and the contacts of the various plug connectors are connected to one another in each case. Hence, a multiplicity of parallel lines is produced via which in each case correspondingly many data can be transmitted during one transmission operation. Apart from these data lines, there are control lines, ground lines and power supply lines.

For the transmission, an asymmetrical drive is often used in which one data line is used per logic signal and is switched with reference to a common ground. In particular, electronic switches are used which connect a potential provided on the data line to a ground line. In the process, because of the inductances and capacitances, slow edges or even oscillations occur on the signal lines during switching on or switching off. This effect can be avoided if the signal lines are terminated with their characteristic impedance. For systems of low speed, a common plug contact for the ground connection of many signal lines is used. Since in this case, via the one or the few ground contacts, considerably higher high-frequency currents flow than via the many signal contacts, interference occurs. One known measure in high-speed applications is therefore the use of one ground contact per signal contact. This solution is ruled out if, for reasons of compatibility, a standardized contact allocation must be used in which the number of ground contacts is fixed.

In the publication DE 38 38 486 A1, a method for producing circuit substrates is specified in which signal lines are located between grounded shields.

In the publication EP 0 414 546 A2, a backplane is specified in which signal lines are arranged between layers for signal ground and voltage supply.

SUMMARY OF THE INVENTION

It is the object of the invention to operate modules on a backplane in such a way that, in spite of asymmetrical operation and a number of signal ground contacts which differs from the number of signal contacts, a high signal speed is possible.

The invention is based on the consideration that, in addition to the plug contacts, which are overloaded in terms of high frequencies, for the signal ground, a considerable number of plug contacts are available for the power supply, these are not loaded in terms of high frequencies and can therefore serve for relieving the contacts for signal ground.

A first solution consists in using the contacts of the voltage supply as an additional high-frequency path, via capacitors. For this purpose, a high-frequency connection must be provided by means of capacitors from the voltage supply to the signal ground to the same extent on the module and the backplane. This requires a number of capacitors which are equal to the product of the number of plug locations and the number of power supply contacts. In this case, these capacitors must be connected with low inductance to the plug contacts, that is to say must be fitted directly alongside them.

As a result of extensive trials, an improved solution could be found in which no capacitors are necessary on the backplane. For this purpose, the voltage supply on the backplane must be implemented in a manner which is equivalent in terms of high frequencies to the signal ground.

This can be achieved if the signal lines have the same characteristic impedance with reference to the signal ground as with reference to the voltage supply. For this purpose, two embodiments could be determined. In the case of a first embodiment, the conductor tracks in a multilayer printed circuit board for signal ground and voltage supply have the same layout and lie in adjacent planes. In this arrangement, the voltage supply is laid in an outer plane and the signal ground in the immediately adjacent plane, and an insulating layer of the least possible thickness is used. The signal lines are led on the opposite outer layer and are separated from the above-mentioned planes by an insulating layer (of the same material) which is of considerably thicker design. Thus, the spacing of the signal lines from the signal ground and of the signal lines from the voltage supply is essentially identical, so that the characteristic impedance with respect to both is not significantly different. A capacitive connection between signal ground and voltage supply is now only necessary at the ends, where the terminating resistors for the signal waveguides are also arranged.

In the case of a third embodiment, the signal lines can be laid in a central layer and signal ground and voltage supply led in the two outer layers. This solution is used if the insulating layer between signal conductor and signal ground is already quite thin and a significantly thinner layer between signal ground and voltage supply can no longer be fabricated.

Hence, the invention takes care that the power supply is also included in the wave guiding of the signal lines. Hence, the capacitors on the plug contacts on the backplane are then dispensable; the desired effect is achieved by means of the layout of the backplane which is realized as a printed circuit.

The invention can also advantageously be applied on a module itself. For example, the electronic switches are arranged remote from the connector contacts. The signal lines, the signal ground and the supply voltage are led, as on the backplane, with the same characteristic impedance between signal line and signal ground and between signal line and supply voltage. An AC coupling is then to be set up directly on the switch, that is to say in particular a low-inductance capacitor is to be connected between signal ground and supply voltage. Such a capacitor is normally already available to buffer the supply voltage. Hence, additional capacitors are no longer necessary, since the acceleration of the signal transmission is achieved merely by means of the clever arrangement of the conductor tracks.

The invention therefore comprises, in a system having modules, voltage supply, signal transmission via terminated signal lines and signal ground, the impedance of the signal lines both with respect to the signal ground and to the voltage supply being identical, an AC coupling of the contacts for the signal ground and voltage supply being effected on the modules and close to the termination of the signal lines.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
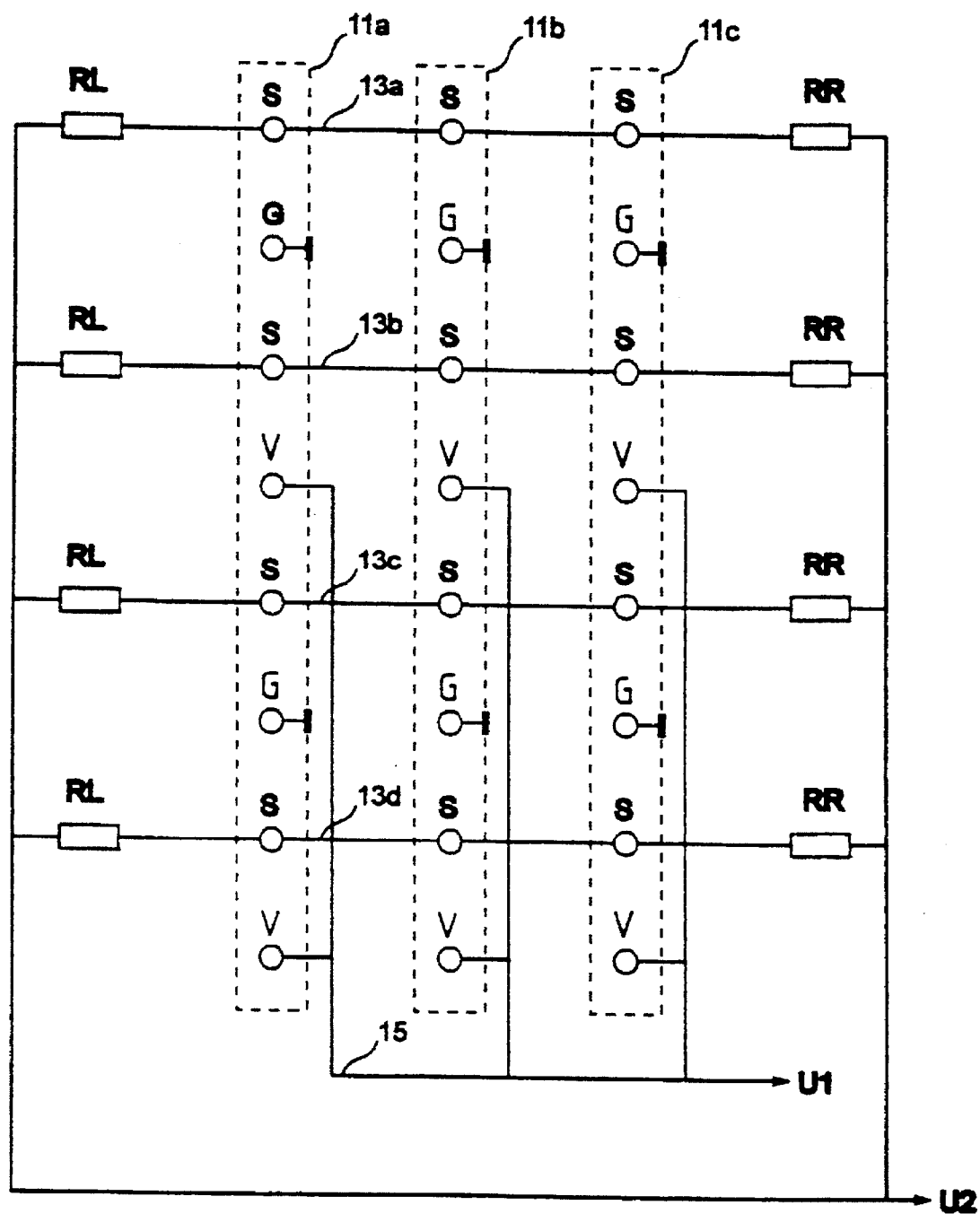
FIG. 1 shows a simplified view of the backplane of a computer.

Shown in FIG. 1 is a backplane 10 which, for improved clarity, is shown with only three connector strips 11a, 11b, 11c and eight contacts per connector strip. The terminals S are signal contacts which are in each case connected to one another via signal lines 13a, 13b, 13c, 13d. The terminals G serve as ground terminals and are connected to one another via ground connections. The terminals V serve for voltage supply and are connected via supply lines 15 to the operating voltage U1. The signal lines are terminated at both ends in the manner of a waveguide by means of terminating resistors RL and RR. In this arrangement, the left-hand resistors RL and the right-hand resistors RR are identical to one another and equal to the characteristic impedance of the signal lines with respect to the signal ground 14 (see FIG. 2). The impedance is determined by the width of each signal line and its electrical spacing with respect to the signal ground 14, which is determined by the dielectric constant of the printed circuit board material and the spatial spacing.

This backplane is operated as a bus system with an open collector structure, in which a LOW bit is signaled by connecting a signal line to ground and a HIGH bit by suppressing this connection. For this purpose, the terminating resistors are DC coupled to a potential U2.

Figure 2:
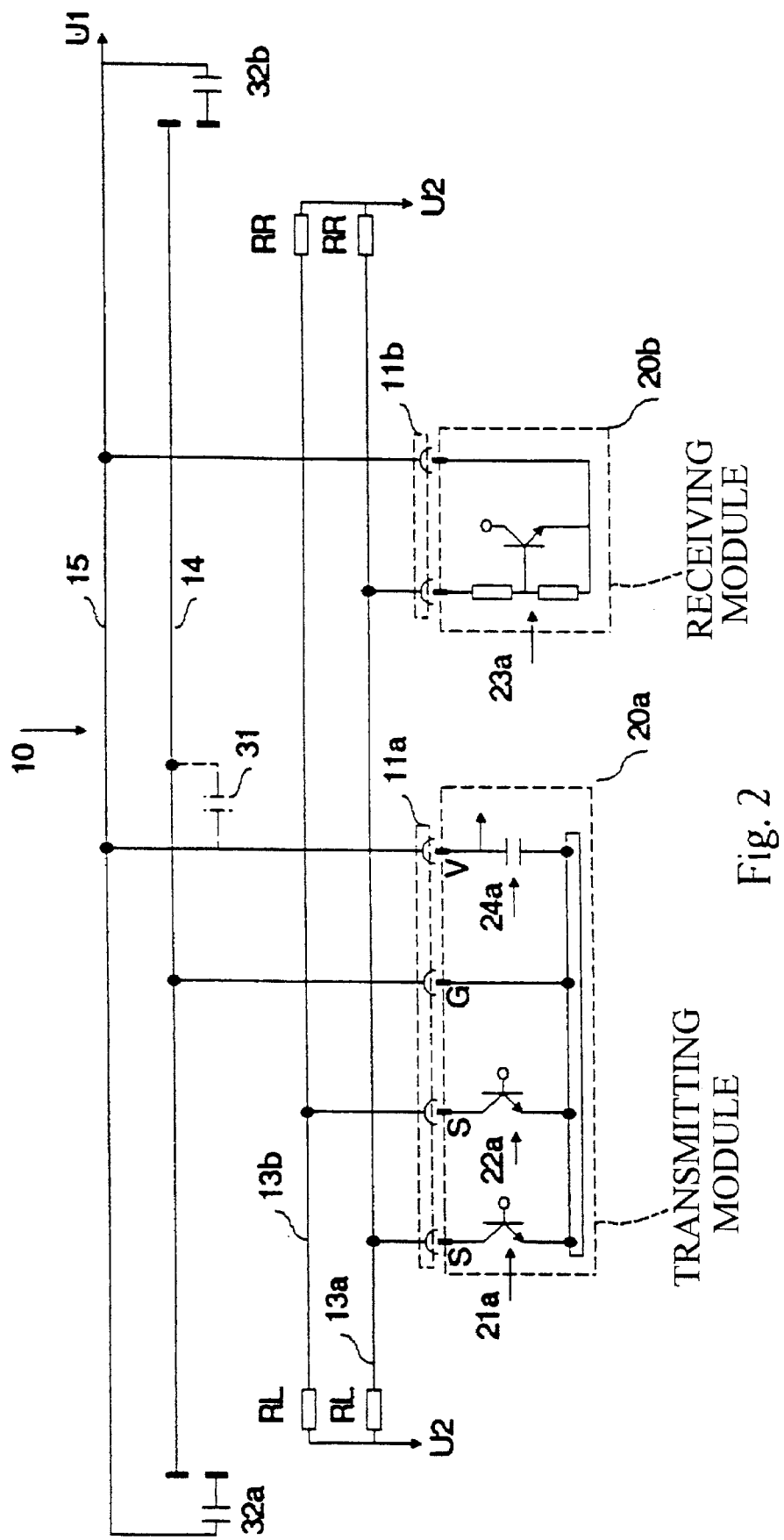
FIG. 2 shows a circuit diagram of the interconnection of modules and the backplane of FIG. 1.

This situation is represented in terms of its electrical effect in FIG. 2, which shows only two of the connector strips (11a and 11b) and which shows only two of the lines (13a and 13b). The parts outside the modules 20a and 20b, which are framed by a dashed line, are located on the backplane. The plug connectors 11a and 11b are fastened on the backplane and make contact with the modules 20a and 20b. In the example of FIG. 2, a transmitting module 20a and a receiving module 20b are depicted. The transmitting means and receiving means shown are present on all the modules for all the signal lines; this is simplified in favor of clarity.

Arranged in the transmitting module 20a is a semiconductor switch 21a which is connected to a signal contact S and a signal ground 22a. The signal contact S is, as already described, connected via the line 13a to both the terminating resistors RL and RR, which are connected for their part to the voltage U2. If the semiconductor switch 21a is not active, the line 13a is at the potential U2. If, on the other hand, the semiconductor switch 21a is active, the current which is determined by the resistors RL and RR flows from the voltage source U2 through the resistors RL and RR, via the signal line 13a, through the contact S, through the semiconductor switch 21a, along the ground line 22a in the module 20a, through the contact G and the ground line 14 back into the voltage source U2. There is thus produced on the line 13a a potential close to ground, which is evaluated by the receiving module 20b using a receiving circuit 23a.

If a plurality of switches 21a are switched simultaneously, the sum of the currents which flow through the contacts S flows through the common contact G. The DC contact resistance is so small in this arrangement that no significant voltage drop is produced.

The relationships at the instant of switching are different. Here, the inductance of the contact pins is determinable. In the case of particularly fast switches 21a, a transient process, which limits the maximum speed of the bus utilization, is produced via the inductance of the contacts.

The contacts for the voltage supply are used simultaneously in an AC manner, so that the inductances of the contact pins are reduced as a result of parallel connection. For this purpose, on each module and on each voltage supply contact V, a capacitor 24a is fitted between the latter and signal ground. On the side of the backplane, the contact V is then likewise AC-connected to the signal ground. For this purpose, a capacitor 31 is added for each contact V.

A significant improvement in which the capacitor 31 can be omitted is achieved by configuring the characteristic impedance of the signal line 13a with reference to the signal ground 14 to be identical to the characteristic impedance of the same signal line 13a with reference to the voltage supply 15. This is achieved in the case of using a printed circuit board by configuring the layout of signal ground 14 and voltage supply 15 to be essentially identical, and by both of them having an approximately identical electrical spacing from the signal line 13a.

Figure 3:
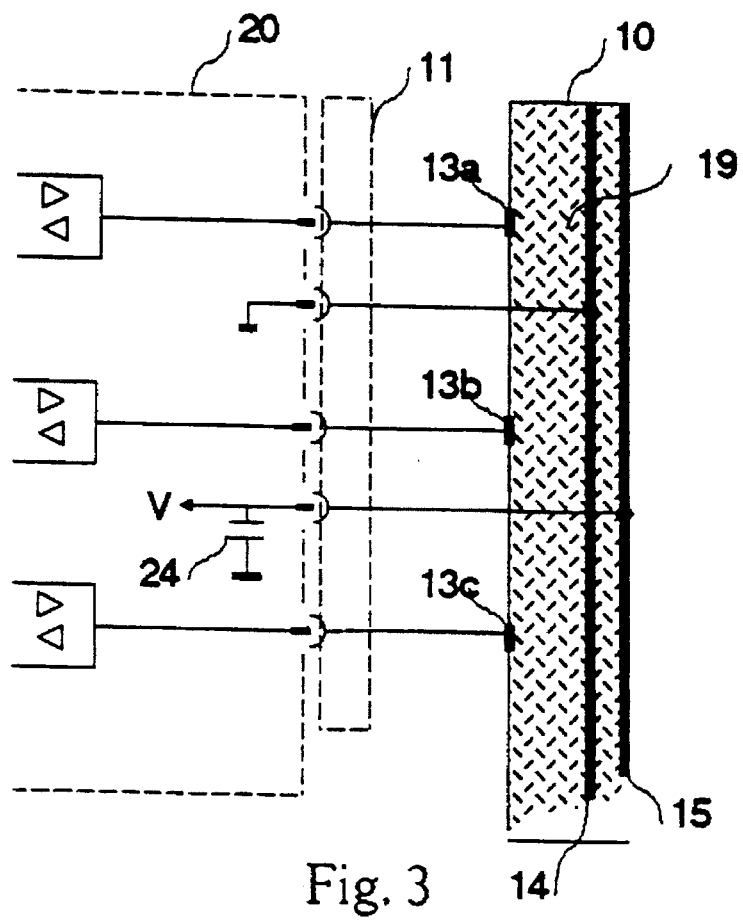
FIG. 3 shows a cross section through the backplane with signal lines located on the outside and FIG. 4 shows a cross section through the backplane with signal lines located on the inside.
Figure 4:
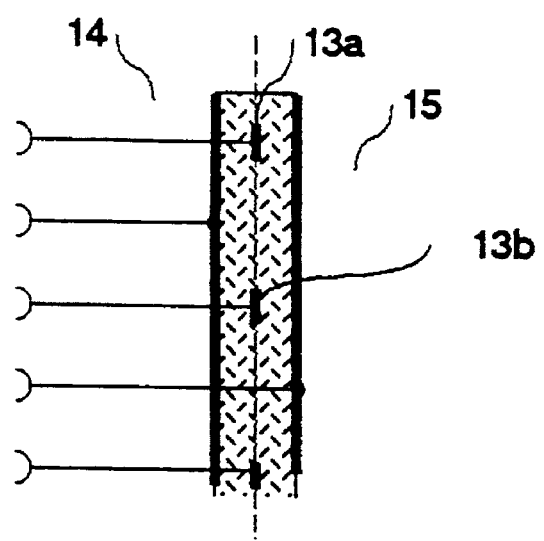

According to FIGS. 3 and 4 (capacitors 32a and 32b are not shown in FIGS. 3 and 4), this is achieved by using a printed circuit board having three layers. According to FIG. 3, the signal lines are on the left-hand outer layer. The right-hand outer layer is used for the voltage supply 15. The signal ground 14 is located directly adjacent, there being a considerably smaller spacing, for example 0.1 mm ±0.05 mm, between voltage supply 15 and signal ground 14 than between the signal lines 13a and the signal ground 14, for example 0.5 mm ±0.1 mm. Signal ground 14 and voltage supply 15 have, from the point of view of the signal lines 13a, predominantly the same layout. Hence, they are equivalent to each other with reference to the wave guiding, and the capacitor 24 is sufficient for coupling the contact V to the signal ground on the module 20a. In FIG. 4, an alternative embodiment is shown in which the signal lines are arranged in the center. This form is advantageous if a smaller characteristic impedance is sought after and hence the spacing of the signal conductors 13a with respect to the signal ground is the smallest which can be produced. In addition, in this embodiment the interfering radiation of the signal lines is shielded.

The invention can advantageously also be applied on a module 20a, if the electronic switches 21a are arranged remotely from the plug contacts. The signal lines, the signal ground 14 and the supply voltage 15 have, as on the backplane 10, identical characteristic impedance between signal line 13a and signal ground 14 and between signal line 13a and supply voltage 15. The AC coupling on the module is effected by a blocking capacitor which is already present, so that the capacitor 24a close to the contacts can be omitted.

It has also proven to be additionally advantageous to fit an attenuator on the module between ground contacts and supply contacts. This is effected preferably by means of a capacitor (32a, 32b) of low quality which, in the event that the capacitors for the connection between signal ground and supply voltage are arranged here, is connected in parallel with these.

The connection can also be used in the case of connectors which are not designed as operationally detachable connectors but even, for example, in the case of modules which are soldered via contacts onto a common carrier board.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. An arrangement for signal transmission between modules which are connected via connectors to a common backplane and which are interconnected via the common backplane, comprising:

signal lines and a common signal ground;

a common voltage supply that is AC coupled to the signal ground;

the signal lines being implemented on the backplane as waveguides, whose characteristic impedance with respect to the signal ground is equal to a characteristic impedance with respect to the voltage supply;

resistors for respectively terminating the signal lines on the backplane with respect to the signal ground of the signal lines ends by means of resistors;

the connectors between the modules and the backplane having a respective contact for each signal line, at least one ground contact for the signal ground and at least one further contact for the voltage supply;

the number of ground contacts for the signal ground being less than the number of contacts for the signal lines;

on each module, first capacitors for respectively AC coupling the voltage supply and the signal ground to the contacts, the first capacitors being located close to the voltage supply and to the signal ground;

on the backplane, second capacitors for effecting AC coupling between the voltage supply and the signal ground, the second capacitors being located close to the terminating resistors.

2. The arrangement as claimed in claim 1, wherein the backplane is made of a substantially homogeneous base material in the form of a board, the signal lines being arranged close to one surface of the base material, and the signal ground and the voltage supply being arranged close to the other surface of the base material, and wherein a first spacing between the signal lines and one of the signal ground and the voltage supply is at least twice as large as a second spacing between the signal ground and the voltage supply.

3. The backplane as claimed in claim 2, wherein a greater spacing of the first and second spacings is 0.5 mm ±0.1 mm and the smaller spacing of the first and second spacing is 0.1 mm ±0.05 mm.

4. An arrangement for signal transmission between modules which are connected via connectors to a common backplane and which are interconnected via the common backplane, comprising:

signal lines and a common signal ground;

a common voltage supply that is AC coupled to the signal ground;

the signal lines being implemented on the backplane as waveguides, whose characteristic impedance with respect to the signal ground is equal to a characteristic impedance with respect to the voltage supply;

resistors for respectively terminating the signal lines on the backplane with respect to the signal ground of the signal lines ends by means of resistors;

the connectors between the modules and the backplane having a respective contact for each signal line, at least one ground contact for the signal ground and at least one further contact for the voltage supply;

the number of ground contacts for the signal ground being less than the number of contacts for the signal lines;

on each module, first capacitors for respectively AC coupling the voltage supply and the signal ground to the contacts, the first capacitors being located close to the voltage supply and to the signal ground;

on the backplane, second capacitors for effecting AC coupling between the voltage supply and the signal ground, the second capacitors being located close to the terminating resistors;

the backplane being made of a substantially homogeneous base material in the form of a board, the signal lines being arranged close to one surface of the base material, and the signal ground and the voltage supply being arranged close to the other surface of the base material; and a first spacing between the signal lines and one of the signal ground and the voltage supply being at least twice as large as a second spacing between the signal ground and the voltage supply.

5. The backplane as claimed in claim 4, wherein a greater spacing of the first and second spacings is 0.5 mm and ±0.1 mm and the smaller spacing of the first and second spacing is 0.1 mm ±0.05 mm.

* * * * *